US 9,536,996 B2

(12) United States Patent
Funabashi et al.

(10) Patent No.: US 9,536,996 B2
(45) Date of Patent: Jan. 3, 2017

(54) APPARATUS AND METHOD OF MANUFACTURING A SUPPORT LAYER

(71) Applicant: KABUSHIKI KAISHA TOYOTA CHUO KENKYUSHO, Nagakute-shi, Aichi-ken (JP)

(72) Inventors: Hirofumi Funabashi, Nagakute (JP); Takashi Ozaki, Nagakute (JP); Isao Aoyagi, Nagakute (JP); Teruhisa Akashi, Nagakute (JP); Yoshiteru Omura, Nagakute (JP); Keiichi Shimaoka, Nagakute (JP); Yutaka Nonomura, Nagakute (JP); Norio Fujitsuka, Nagakute (JP); Motohiro Fujiyoshi, Nagakute (JP); Yoshiyuki Hata, Nagakute (JP); Kanae Murata, Nagakute (JP); Tetsuo Narita, Nagakute (JP); Kazuyoshi Tomita, Nagakute (JP)

(73) Assignee: KABUSHIKI KAISHA TOYOTA CHUO KENKYUSHO, Nagakute (JP)

( * ) Notice: Subject to any disclaimer, the term of this patent is extended or adjusted under 35 U.S.C. 154(b) by 0 days.

(21) Appl. No.: 14/811,965

(22) Filed: Jul. 29, 2015

(65) Prior Publication Data

US 2016/0043066 A1 Feb. 11, 2016

(30) Foreign Application Priority Data

Aug. 5, 2014 (JP) .................................. 2014-159825
Jul. 23, 2015 (JP) .................................. 2015-145787

(51) Int. Cl.
*H01L 29/00* (2006.01)
*H01L 29/778* (2006.01)
*H01L 23/427* (2006.01)
*H01L 21/48* (2006.01)
*H01L 29/20* (2006.01)

(Continued)

(52) U.S. Cl.
CPC ....... *H01L 29/7786* (2013.01); *H01L 21/4882* (2013.01); *H01L 23/427* (2013.01); *H01L 29/1066* (2013.01); *H01L 29/2003* (2013.01); *H01L 29/41758* (2013.01); *H01L 2924/0002* (2013.01)

(58) Field of Classification Search
CPC ... H01L 21/4871; H01L 21/4882; H01L 23/36
See application file for complete search history.

(56) References Cited

U.S. PATENT DOCUMENTS

2003/0173720 A1\* 9/2003 Musso ................ C04B 38/0006
264/635
2007/0256810 A1\* 11/2007 Di Stefano ........... H01L 23/473
165/46

(Continued)

FOREIGN PATENT DOCUMENTS

JP 2005-127786 A 5/2005
JP 2006-294961 A 10/2006

(Continued)

*Primary Examiner* — Armando Rodriguez
(74) *Attorney, Agent, or Firm* — Oliff PLC

(57) ABSTRACT

Teaching disclosed herein is an apparatus comprising a support layer. The support layer may be adapted for supporting a heat generator, wherein the support layer includes a flow passage. The flow passage may seal working fluid therein. The flow passage may extend along a thickness direction of the support layer.

15 Claims, 14 Drawing Sheets

(51) Int. Cl.
    *H01L 29/417*     (2006.01)
    *H01L 29/10*      (2006.01)

(56)         References Cited

U.S. PATENT DOCUMENTS

2012/0068227 A1    3/2012   Hikita et al.
2013/0223010 A1    8/2013   Shioga et al.

FOREIGN PATENT DOCUMENTS

| | | |
|---|---|---|
| JP | 2006-310363 A | 11/2006 |
| JP | 2008-270296 A | 11/2008 |
| JP | 2009-176881 A | 8/2009 |
| JP | 2012-064900 A | 3/2012 |
| JP | 2014-078537 A | 5/2014 |
| WO | 2012/046338 A1 | 4/2012 |

\* cited by examiner

APPARATUS AND METHOD OF MANUFACTURING A SUPPORT LAYER

CROSS-REFERENCE TO RELATED APPLICATION

This application claims priority to Japanese Patent Application No. 2014-159825 filed on Aug. 5, 2014 and Japanese Patent Application No. 2015-145787 filed on Jul. 23, 2015, the contents of which are hereby incorporated by reference into the present application.

TECHNICAL FIELD

Disclosed herein relates to an apparatus comprising a support layer and a manufacturing method of such an apparatus.

DESCRIPTION OF RELATED ART

There are many situations under which a temperature of a heat generator should be maintained low in order to allow the heat generator performing a particular function to operate stably. For example, a semiconductor device necessitates a technique for effectively releasing heat from a semiconductor element that is being a heat generator, so as to allow the semiconductor element to operate stably.

As disclosed in Japanese Patent Application Publication No. 2012-64900, as an example of the semiconductor device, a device including a lateral HFET of which material is a nitride semiconductor has been developed. This type of semiconductor device includes a support layer and a semiconductor layer. The semiconductor layer is crystal-grown on the support layer and has a channel layer of gallium nitride (GaN) and a barrier layer of aluminum nitride gallium (AlGaN). The channel layer and the barrier layer are connected by a hetero junction, and a two-dimensional electron gas layer is generated in a vicinity of a hetero junction interface. This type of semiconductor device further includes a source electrode, a drain electrode and a gate electrode arranged on an upper surface of the semiconductor layer. Electric current flowing between the source electrode and the drain electrode flows in a lateral direction via the two-dimensional electron gas layer in the semiconductor layer, and is controlled by a potential applied to the gate electrode.

Joule heat is generated when electric current flows through the semiconductor layer. To ensure stable operation of a semiconductor device, heat generated in the semiconductor layer needs to be released effectively so as to maintain a temperature of the semiconductor layer at a low level. To this end, a semiconductor device is often used in a state of being fixed to a water-cooled cooler as disclosed in Japanese Patent Application Publication No. 2006-310363.

BRIEF SUMMARY OF INVENTION

In a semiconductor device disclosed herein, heat generated in a semiconductor layer is transferred via a support layer to a cooler. To this end, it is important to improve heat conductivity performance of the support layer in order to maintain a temperature of the semiconductor device at a low level. In the above, a problem concerned in the heat conductivity performance of the support layer was explained by presenting an example where the heat generator is a semiconductor element. However, such a problem is not limited to cases where the heat generator is a semiconductor element. A heat generator performing a specific function is often used in the state of being supported by the support layer. For this reason, a technique of improving the heat conductivity performance of the support layer has been widely desired in order to transfer effectively the heat generated by the heat generator.

An apparatus disclosed herein comprises a support layer adapted for supporting a heat generator. The support layer includes a flow passage in which working fluid is sealed. The flow passage extends along a thickness direction of the support layer. According to this apparatus, the flow passage of the support layer serves as a heat pipe. Thus, heat conductivity performance of the support layer is improved.

A method of manufacturing an apparatus disclosed herein comprises: crystal-growing a semiconductor layer on a support layer; forming a semiconductor region in the semiconductor layer; forming a flow passage by processing the support layer; and sealing working fluid in the flow passage. The semiconductor region configures a semiconductor element In the apparatus manufactured by this manufacturing method, the semiconductor element is the heat generator. The flow passage extends in the thickness direction of the support layer. By these processes, the apparatus comprising the support layer of which heat conductivity performance has been improved can be produced.

DETAILED DESCRIPTION OF INVENTION

Figure 1:
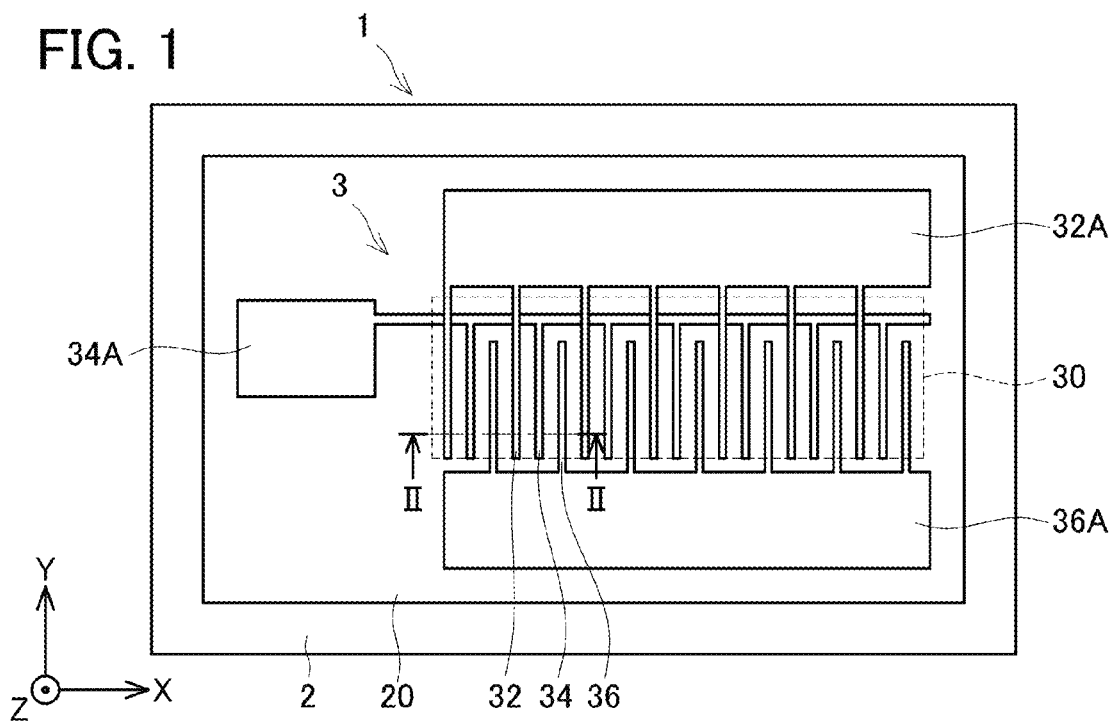
FIG. 1 illustrates a schematic plan view of a semiconductor module.

Hereinafter, preferred aspects of the technique disclosed herein are summarized. Notably, each of matters described hereinbelow is technically useful alone or in various combinations.

An apparatus disclosed herein may comprise a support layer adapted for supporting a heat generator. The heat generator may perform a specific function, and an example thereof includes a semiconductor element. The support layer may include a flow passage in which working fluid is sealed. The flow passage may implement various types. of heat pipes. For example, the flow passage may be configured as a capillary type heat pipe using capillarity phenomenon, a self-excited oscillating type heat pipe using self-excited oscillation, or a gravity type heat pipe using gravity, or a combination thereof.

A material of the support layer is not especially limited. For example, the material of the support layer may be a semiconductor. In a case where the support layer is made of a semiconductor, a flow passage of the support layer may be formed using a semiconductor manufacturing method. Alternatively, the material of the support layer may be metal, resin or glass. In a case where the support layer is made of one or more of these materials, the support layer including a flow passage may be formed using for example, an optical imprinting technology, a heat imprinting technology or a three-dimensional printing technology.

An apparatus disclosed herein may comprise a two-pass passage along a thickness direction of the support layer. The two-pass passage may be implemented as various types of heat pipes. For example, the two-pass passage may be configured as a capillary type heat pipe using capillarity phenomenon, a self-excited oscillating type heat pipe using self-excited oscillation, or a gravity type heat pipe using gravity, or a combination thereof. Generally, the two-pass passage may be configured as a self-exciding oscillating type heat pipe in which a heat generator side end serves as a heating part and an end on the opposite side serves as a cooling part.

In the above apparatus, the flow passage may comprise a plurality of straight passages which extends along the thickness direction of the support layer. The straight passage may be implemented as various types of heat pipes. For example, the straight passage may be configured as a capillary type heat pipe using capillarity phenomenon, a self-excited oscillating type heat pipe using self-excited oscillation, or a gravity type heat pipe using gravity, or a combination thereof. Generally, each straight passage may be configured as a capillary type heat pipe in Which a heat generator side end serves as a heating part and an end on the opposite side serves as a cooling part.

In a case where the straight passages are configured as capillary tubes for causing capillarity phenomenon, one or more of the straight passages are tapered toward the heat generator. In other words, a sectional area of the straight passage in a direction perpendicular to the thickness direction of the support layer may be configured to be smaller on a closer side to the heat generator. This straight passage can make the working fluid move toward the heat generator by using the capillarity phenomenon. Thus, the straight passage can have a higher heat conductivity performance.

Wick structures may be disposed on inner surfaces of one or more of the straight passages. Formation particulars of the wick structure may not be limited so long as the capillarity phenomenon can be caused. For example, the wick structure may be a corrugated pattern, which is formed of recesses and projections that extend along the thickness direction of the support layer and are alternately arranged, or may he porous; or may be a combination thereof. Further, the wick structure may be configured by processing the support layer itself, that is, being formed of the support layer, or configured of a separate member from the support layer.

An aspect of an apparatus disclosed herein may further comprise a semiconductor layer. The semiconductor layer is disposed on a support layer. The semiconductor layer comprises a semiconductor region. The semiconductor region configures a semiconductor element. The apparatus herein may be mentioned as a semiconductor device. In this device, the semiconductor element serves as a heat generator. The support layer and the semiconductor layer may be a die which has been cut from a semiconductor wafer by dicing. To this end, the semiconductor device may be mentioned as a semiconductor chip. A material of the support layer may not be especially limited, however, it is preferable that the material is a semiconductor. For example, the material of the support layer may be a material which can be used as a base on which a crystal-growing of the semiconductor layer can be made. The semiconductor layer may be provided in contact with an upper surface of the support layer and/or provided on the support layer via another layer interposed therebetween. For example, the semiconductor layer may be arranged on the support layer via an insulation layer. A semiconductor element is an element in which electric current flows through the semiconductor layer and its type may not be especially limited. For example, the semiconductor element may be a HFET, HEMT, IGBT, MOSFET or diode.

The apparatus disclosed herein may further comprise a source electrode, a drain electrode, and a gate electrode. The source electrode may be in contact with an upper surface of the semiconductor layer and extend along one direction. The drain electrode may be in contact with the upper surface of the semiconductor layer and extend along the one direction.

The gate electrode may be disposed above the upper surface of the semiconductor layer, be located between the source electrode and the drain electrode, and extend along the one direction. The gate electrode may be in contact with the upper surface of the semiconductor layer, and may face the upper surface of the semiconductor layer via a gate insulating film. In a view along a direction which is orthogonal to the upper surface of the semiconductor layer, the flow passage may be selectively located according to an existing area of the source electrode, the drain electrode and the gate electrode. Herein, the existing area of the source electrode, drain electrode and gate electrode may he referred to as an area in which a current passage of electric current flowing between the source electrode and the drain electrode, is present. Therefore, the flow passage may be selectively arranged depending on the existing area of the electric current passage as seen along the direction perpendicular to the upper surface of the semiconductor layer. Thus, by restricting a location of the flow passage formed in the support layer, the apparatus according to this embodiment can achieve both of high rigidity and high cooling performance.

In the apparatus disclosed herein, in the view along the direction Which is orthogonal to the upper surface of the semiconductor layer, the flow passage may be selectively located according to the existing area of the gate electrode. In other words, the flow passage may he arranged along a layout of the gate electrode as seen along the direction perpendicular to the upper surface of the semiconductor layer. Since in the apparatus according to this embodiment the location of the flow passage formed in the support layer is further restricted, the apparatus can further improve the achievement of high rigidity and high cooling performance.

In the apparatus according to the above embodiments, a material of the support layer may be a semiconductor different from that of the semiconductor layer. For example, a material of the support layer may be silicon, and a material of the semiconductor layer may be a nitride semiconductor.

An aspect of the apparatus disclosed herein may further comprise a heat dissipation plate made of metal. The heat dissipation plate may be disposed under the support layer and include a communication passage communicating with the flow passage of the support layer. The heat dissipation plate may be in contact with a lower surface of the support layer and/or may be arranged below the support layer via another layer. Since heat transfer from the working fluid to the heat dissipation plate is performed effectively in the apparatus, cooling performance is further improved.

A method of manufacturing a semiconductor device disclosed herein may comprise: crystal-growing a semiconductor layer on a support layer; forming a semiconductor region in the semiconductor layer; forming a flow passage by processing the support layer; and sealing working fluid in the flow passage. The flow passage may extend along the thickness direction of the support layer. Although a material of the support layer may not be especially limited, it is preferable that the material is a semiconductor.

First Embodiment

Figure 2:
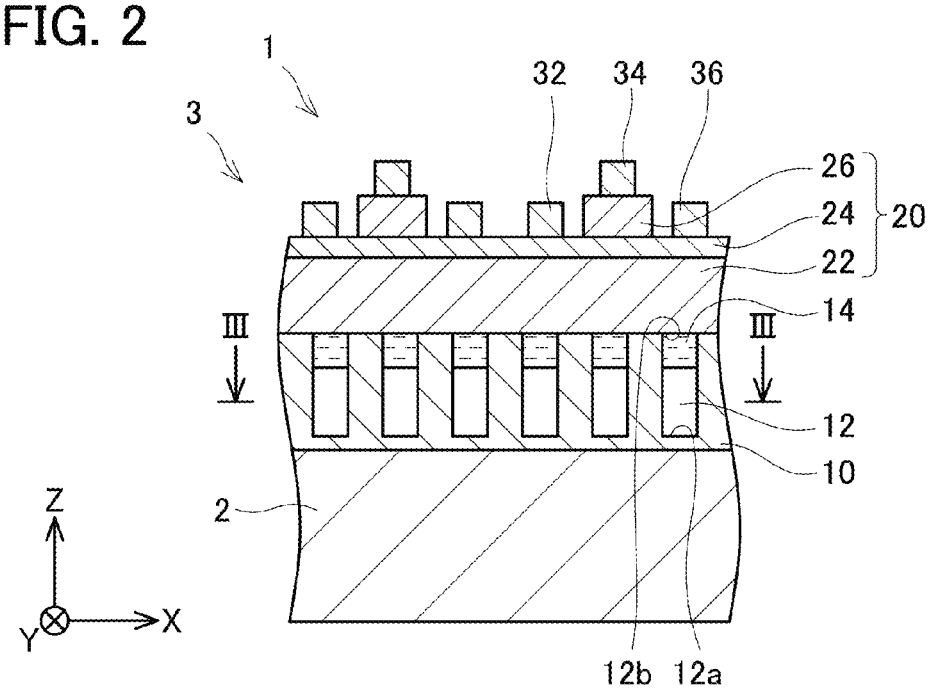
FIG. 2 illustrates a schematic sectional view of a principle part along line II-II of FIG. 1.

As shown in FIGS. 1 and 2, a semiconductor module 1 comprises a heat dissipation plate 2 and a semiconductor device 3. The heat dissipation plate 2 is made of a metal having a high heat conductivity such as copper or aluminum. A water-cooling or air-cooling refrigerator (not shown) is provided on a lower surface of the heat dissipation plate 2. The semiconductor device 3 (also referred to as a semiconductor chip) has a horizontal HFET and is used as a power semiconductor device for controlling power.

As shown in FIG. 2, the semiconductor device 3 comprises a support layer 10 and a semiconductor layer 20. As mentioned later, the semiconductor layer 20 is disposed on the support layer 10 by crystal growing, and comprises a channel layer 22 made of a non-doped gallium nitride (GaN), a barrier layer 24 made of non-doped aluminum nitride gallium (AlGaN), and a p-GaN layer 26 made of p-type gallium nitride (GaN). The channel layer 22 and the barrier layer 24 form a hetero-junction, and a two-dimensional electron gas layer is generated in the vicinity of their hetero junction interface. The p-GaN layer 26 is selectively disposed under a gate electrode 34 as mentioned later.

As shown in FIG. 1, the semiconductor device 3 further comprises a source terminal 32A, a plurality of source electrodes 32, a gate terminal 34A, a plurality of gate electrodes 34, a drain terminal 36A and a plurality of drain electrodes 36.

The source terminal 32A is formed via an insulating layer (not shown) on an upper surface of the barrier layer 24. Each of the plurality of source electrodes 32 extends from the source terminal 32A along a Y direction, and is in ohmic contact with the upper surface of the barrier layer 24. The plurality of source electrodes 32 is disposed in parallel along an X direction.

The drain terminal 36A is farmed via the insulating layer (not shown) on the upper surface of the barrier layer 24, and is disposed away from the source terminal 32A along the Y direction. Each of the plurality of drain electrodes 36 extends from the drain terminal 36A along the Y direction, and is in ohmic contact with the upper surface of the barrier layer 24. The plurality of drain electrodes 36 is disposed in parallel along the X direction. The source electrodes 32 and the drain electrodes 36 are alternatively disposed along the X direction.

The gate terminal 32A is formed via the insulating layer (not shown) on the upper surface of the barrier layer 24. Each of the plurality of gate electrodes 34 extends along the Y direction from a gate wiring, which is a portion of the gate terminal 34A and extends along the X direction. Each of the plurality of gate electrodes 34 is in Schottky contact with an upper surface of the p-GaN layer 26. The plurality of gate electrodes 34 is disposed in parallel along the X direction. Each of the plurality of gate electrodes 34 is disposed between the source electrode 32 and the drain electrode 36 in a view along a direction orthogonal to the upper surface of the semiconductor layer 20 (Z direction). An area where the source electrodes 32, the gate electrodes 34 and the drain electrodes 36 are disposed, corresponds to a current passage of an electric current flowing in the semiconductor layer 20, and is referred to as an active area 30.

As shown in FIG. 2, the support layer 10 may be directly bonded to an upper surface of the heat dissipation plate 2 or may be bonded via a metal bonding layer or a resin adhesive to the upper surface of the heat dissipation plate 2. A plurality of straight passages 12, which operates as a capillary-type heat pump, is formed in the support layer 10. Each of the plurality of straight passage 12 extends along a thickness direction of the support layer 10 (Z direction), and is disposed in parallel along the X direction. The plurality of straight passages 12 is selectively located according to the active area 30 (see FIG. 1) on the upper surface of the semiconductor layer 20 in the view along the direction orthogonal to the upper surface of the semiconductor layer 20 (Z direction). In other words, the plurality of straight passages 12 is not formed in an area where the source terminal 32A, the gate terminal 34A and the drain terminal 36A exist, in the view along the direction orthogonal to the upper surface of the semiconductor layer 20 (Z direction). Water as working fluid 14 is filled into a part of each of the plurality of straight passages 12. A liquid such as an alcohol or a CFC (a chlorofluorocarbon) may be used as the working fluid 14 in place of water.

Figure 3:
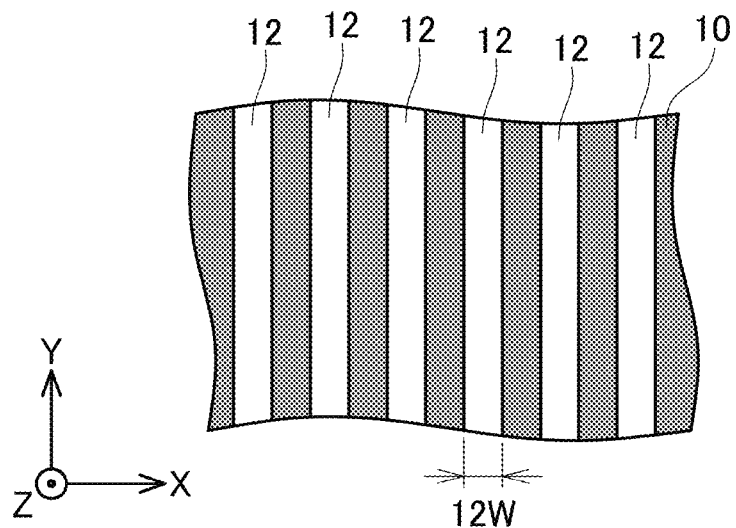
FIG. 3 illustrates a schematic sectional view of a principle part along line III-III of FIG. 2.

As shown in FIG. 3, the plurality of straight passages 12 has a stripe-like layout. Each of the plurality of straight passages 12 is constituted with an extremely small width 12W of a parallel direction (X direction), about 0.1 to 100 μm, preferably 5 to 50 μm. In this way, since the width of each of the plurality of straight passages 12 is extremely small, each of the plurality of straight passages 12 serves as a capillary tube generating capillary phenomenon. Thus, as shown in FIG. 2, the working fluid 14 filled into each of the plurality of straight passage 12 moves from a lower end 12a toward an upper end 12b of the straight passage 12 due to the capillary phenomenon.

When the semiconductor device 3 is turned on, an electric current flowing between the source electrodes 32 and the drain electrodes 36 flows via the two-dimensional electron gas layer generated in the vicinity of the heterojunction between the channel layer 22 and the barrier layer 24 along a lateral direction, and is controlled by a voltage applied to the gate electrodes 34. When the electric current flows along the lateral direction in the semiconductor 20, Joule heat is generated. The working fluid 14, which was localized in the upper end 12b of each of the straight passages 12 of the support layer 10, evaporates due to the heat generated in the semiconductor layer 20 to generate vapor. The vapor generated as above moves to the lower end 12a of each of the straight passages 12. The vapor moving to the lower end 12a of each of the straight passages 12 is cooled by the heat dissipation plate 2, condensed to return to a fluid. The liquefied working fluid 14 moves to the upper end 12b of each of the straight passages 12 due to the capillary phenomenon. In this way, the heat is efficiently transferred from the upper end 12b to the lower end 12a of the support layer 10 due to latent heat movement by evaporation and condensation. Since the support layer 10 has the plurality of straight passages 12 that works as a heat pump, the support layer 10 has a highly efficient heat transportation performance. Accordingly, the semiconductor device 3 is kept at a low temperature during operation and thereby can operate stably. Specifically, since the semiconductor device 3 has a horizontal WET made of a nitride semiconductor and large electric current flow via the two-dimensional electron gas layer, heat generation is large. It is extremely useful to adopt the support layer 10 having a heat pipe to the semiconductor device 3 like this in terms of stable operation.

The support layer 10 of this kind of the semiconductor device 3 serves to reinforce the semiconductor layer 20, which is a thin film formed thereon. As described above, the plurality of straight passages 12 in the support layer 10 is selectively located at the lower side of the active area 30 (see FIG. 1). Since the straight passages 12 are not formed in most area of the support layer 10, a high rigidity of the support layer 10 is maintained. Accordingly, the semiconductor device 3 has both the high rigidity and the high cooling performance.

Figure 4:
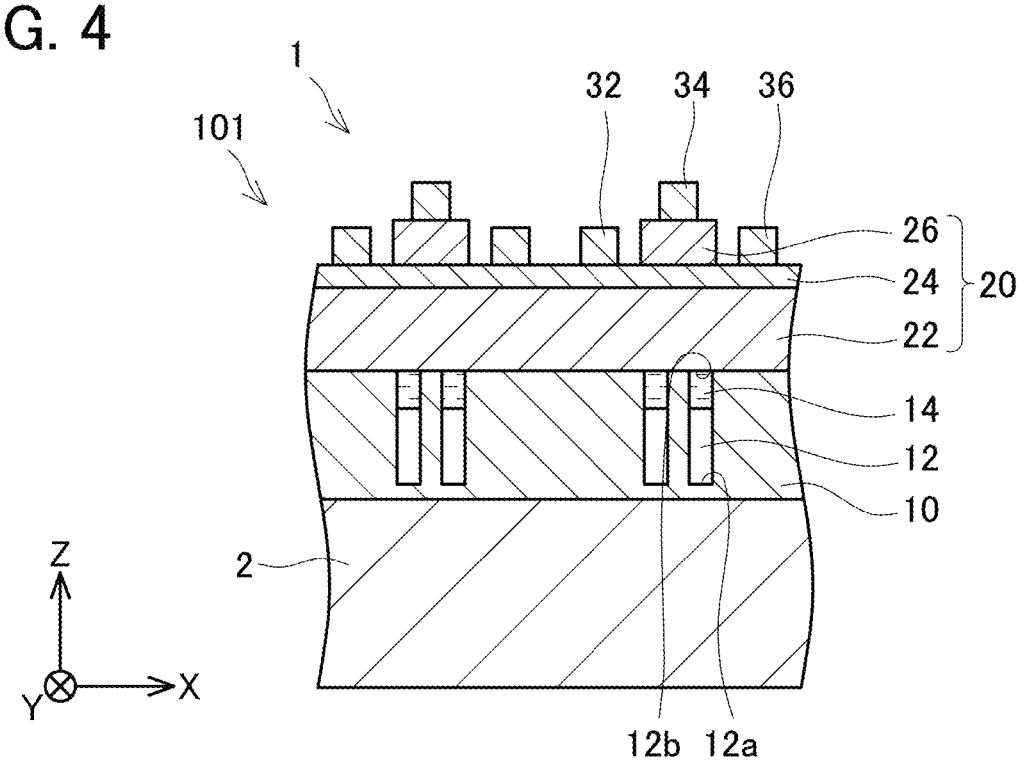
FIG. 4 illustrates a schematic sectional view of a principle part of a semiconductor module comprising a semiconductor device according to a modification.

As described above, when the semiconductor device 3 is turned on, the electric current flow in the lateral direction in the vicinity of the heterojunction of the channel layer 22 and the bather layer 24. At this time, since an electric resistance is highest at the lower side of the gate electrodes 34, a temperature rise due to joule heat is concentrated at the lower side of the gate electrodes 34. Thus, the plurality of straight passages 12 may he selectively formed according to the existing area of the gate electrodes 34 in the view along the direction orthogonal to the upper surface of the semiconductor device 20 (Z direction) like a semiconductor device. 101 of a modification shown in FIG. 4. The semiconductor device 101 of this modification may be kept at a low temperature during operation, and stable operation can be performed. Thus, the semiconductor device 101 of this modification can have both the high rigidity and the high cooling performance.

Figure 5:
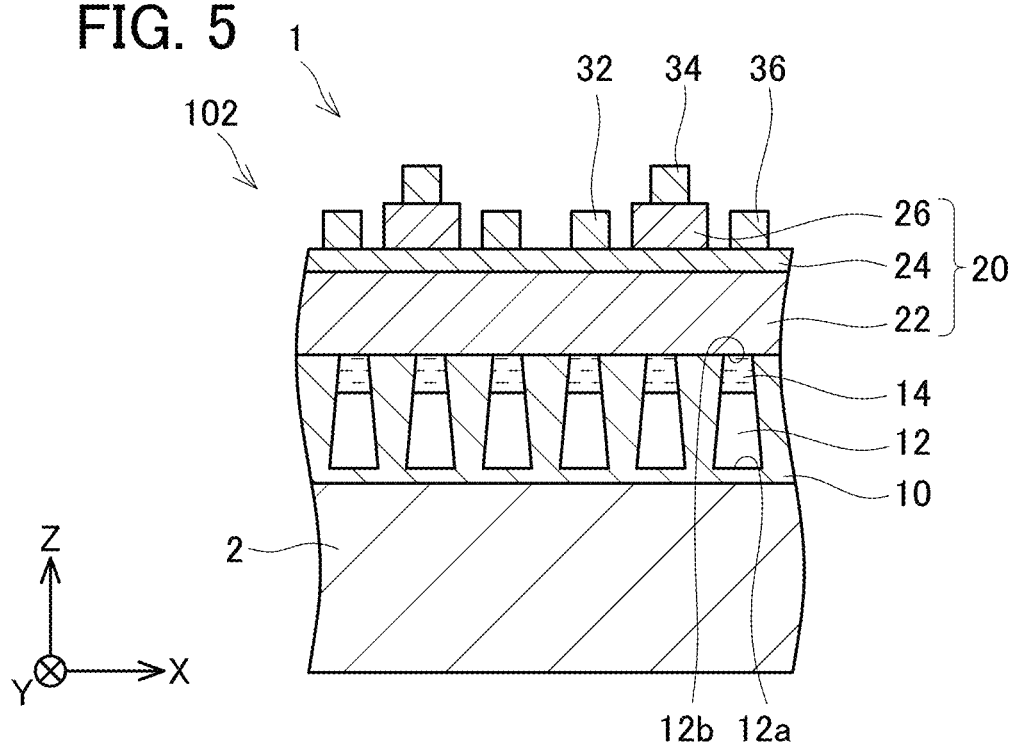
FIG. 5 illustrates a schematic sectional view of a principle part of a semiconductor module comprising a semiconductor device according to a modification.

In the semiconductor device 102 of the modification shown in FIG. 5, each of the plurality of straight passages 12 is tapered toward the upper end 12b. In the semiconductor device 102 of the modification, the working fluid 14 which liquefies at the lower end 12a of each of the straight passages 12, moves to the upper end 12b of the each of the straight passages 12 due to the capillary phenomenon in a short period of time. Thus, the heat transport performance of the straight passages 12 is substantially improved.

Figure 6:
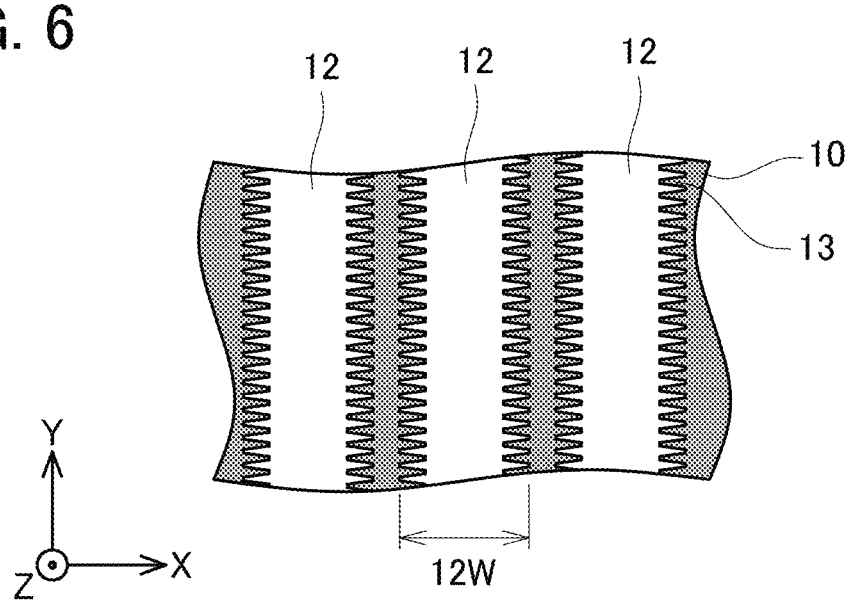
FIG. 6 illustrates a schematic sectional view along line III-III of FIG. 2, of the principle part of a support layer according to a modification.

In the above embodiment and modifications thereof, aspects in which the straight passages 12 configured to have the thin width 12W generate the capillary phenomenon, are exemplified. This is merely an embodiment, and various techniques known in the technical field of heat pipes can be adapted in order to move the working fluid 14 inside the straight passages. For example, as the support layer 10 shown in FIG. 6, a wick structure 13 generating the capillary phenomenon may be disposed on an inner surface of each of the straight passages. The wick structure 13 of this embodiment is formed by processing the inner surface of the straight passages 12, and is composed of convexes and concaves extending along the thickness direction (Z direction) to be corrugated. In the semiconductor device 103 of this modification, the working liquid 14 condensed and liquefied can move via the wick structure 13 on the inner surface of the straight passages 12 to the upper end 12b of each of the straight passages 12. In this case, the width 12W of the straight passages 12 does not need to become small. Further, since the corrugated wick structure 13, which is disposed on the inner surface of the straight passages 12, can increase an area of the inner surface of the straight passages 12, it can efficiently generate the capillary phenomenon. The support layer 10 is minute, for example, several tens of millimeters square. It is important to efficiently cause the capillary phenomenon in a limited area in the support layer 10 like this. Thus, it is very useful that the wick structure 13 is adopted in the straight passages 12 so that the capillary phenomenon of the straight passages 12 formed in the support layer 10 becomes active. Further, since the corrugated wick structure 13 disposed on the inner surface of the straight passages 12 can increase the area of the inner surface of the straight passages 12, it can efficiently cool the vapor of the working fluid 14, and it can easily liquefy the vapor of the working fluid 14. It is quite important that the vapored working fluid is efficiently liquefied in order to activate the heat transfer due to the evaporation and condensation in the minute support layer 10. Also in this respect, it is quite important to adopt the wick structure 13 to the straight passages 12. As another embodiment, if the upper terminal 12b of each of the straight passages 12 is disposed at a lower position in a vertical direction, the working fluid 14 which was condensed and liquefied can move to the lower end 12a of the straight passages 12 due to gravity. Also in this case, since the width 12W of each of the straight passages 12 doesn't need to be small, the processing of the straight passages 12 can be facilitated.

Figure 7:
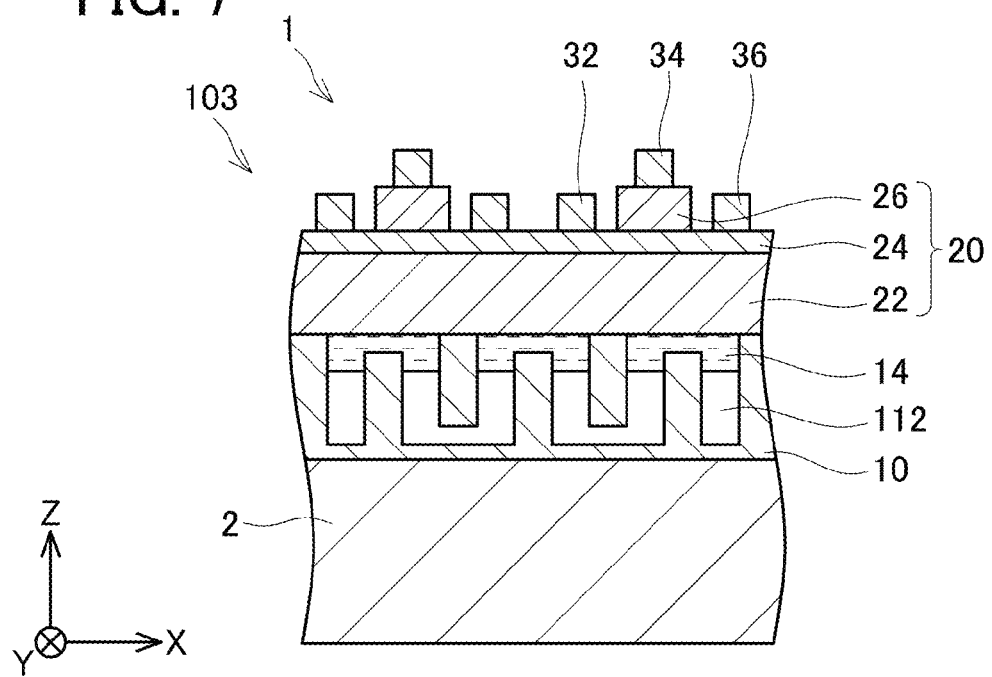
FIG. 7 illustrates a schematic sectional view of a semiconductor module comprising a semiconductor device according to a modification.
Figure 8:
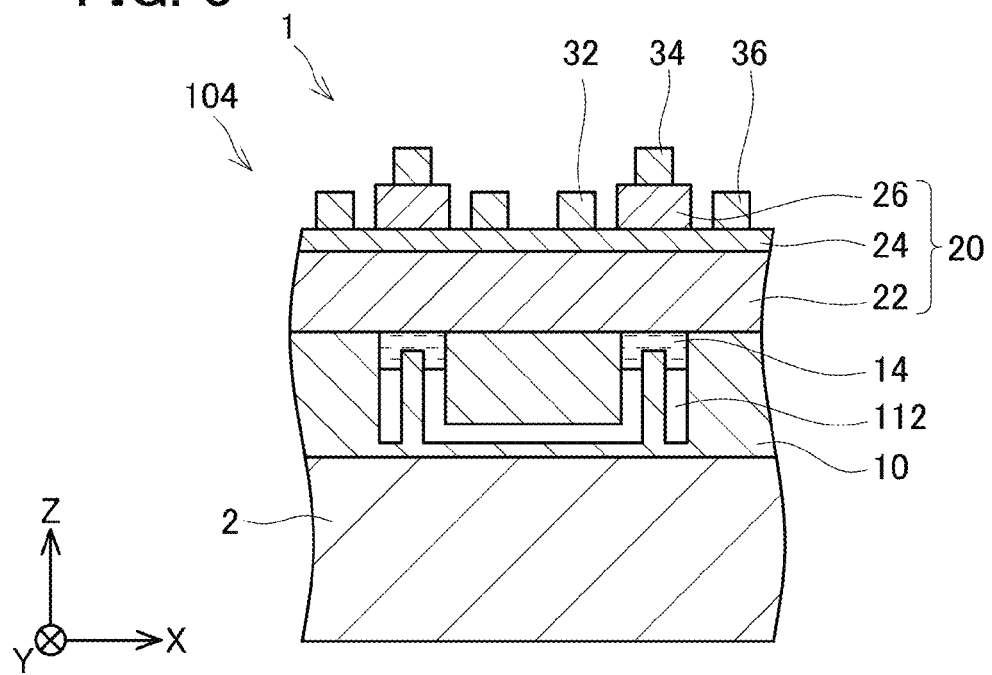
FIG. 8 illustrates a schematic sectional view of a semiconductor module comprising a semiconductor device according to a modification.

The semiconductor device 103 of the modification shown in FIG. 7, a reciprocating passage 112 working as a self-exciting oscillating heat-typed pipe is formed in the support layer 10. The reciprocating passage 112 is configured to reciprocate along the thickness direction of the support layer 10 (Z direction). In the semiconductor device 103 of this modification, the working liquid 14 filled into the part of the reciprocating passage 112 can transport the heat generated in the semiconductor layer 20 to the heat dissipation plate 2 by self-excited longitudinal oscillation of the reciprocating passage 112. Since the self-exciting oscillating type heat pipe has a higher heat transportation performance than a capillary-typed heat pipe, the semiconductor device 103 of this modification has a high cooling performance. As shown in FIG. 8, a part of the reciprocating passage 112 which extends along the thickness direction of the reciprocating passage 112 may he selectively located according to the existing area of the gate electrodes 34 in the view along the direction orthogonal to the upper surface of the semiconductor layer 20 (Z direction). Thus, the semiconductor device 104 of this modification can have both the high rigidity and the high cooling performance.

Figure 9:
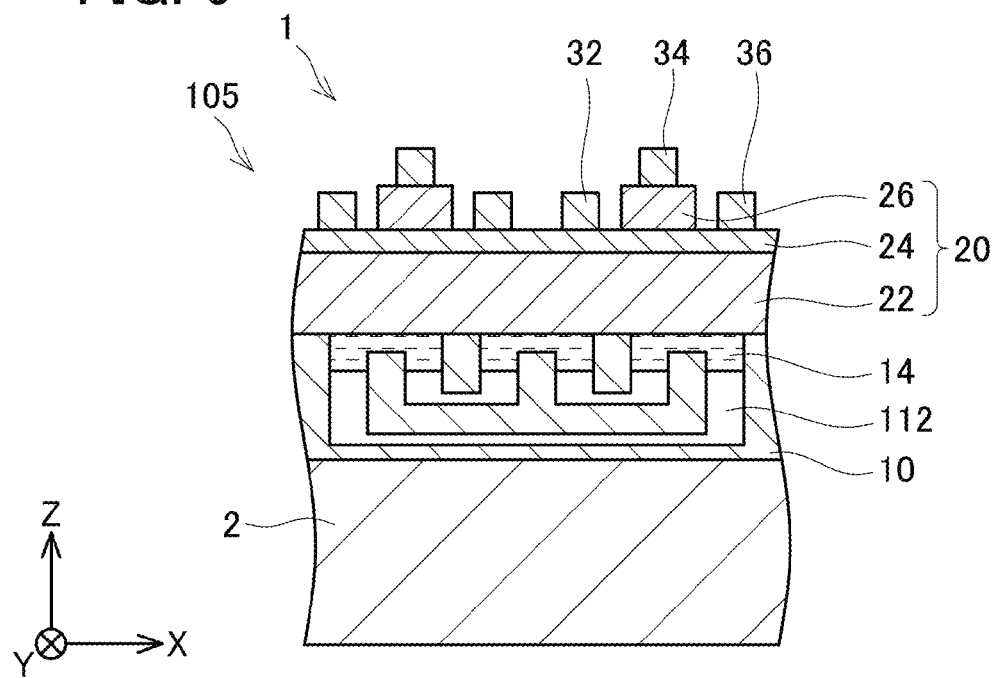
FIG. 9 illustrates a schematic sectional view of a semiconductor module comprising a semiconductor device according to a modification.
Figure 10:
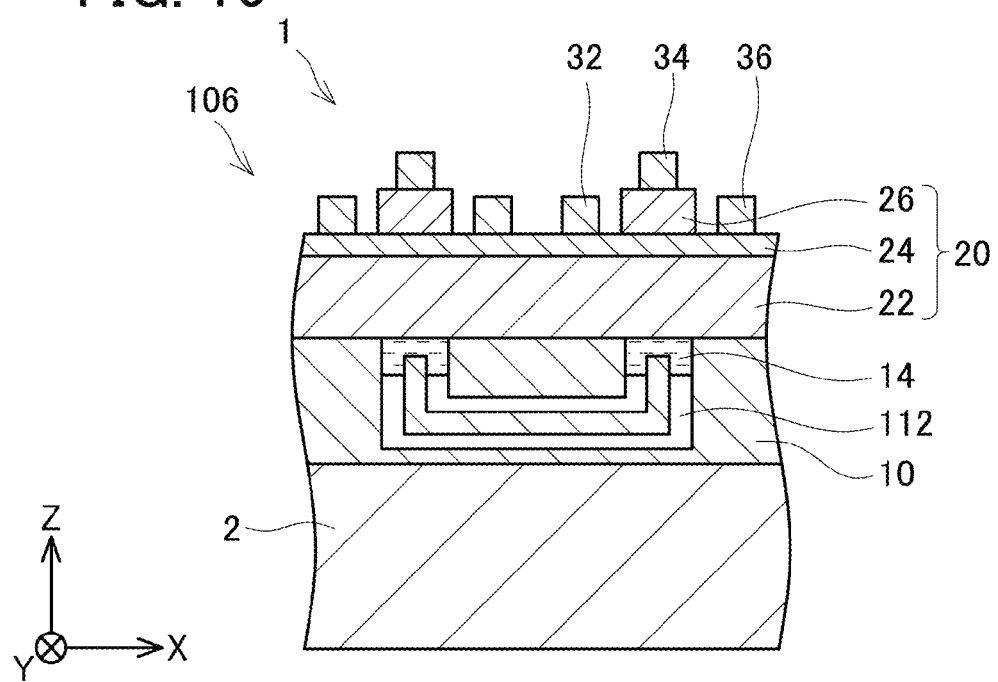
FIG. 10 illustrates a schematic sectional view of a semiconductor module comprising a semiconductor device according to a modification.

As shown in FIG. 9, in the semiconductor device 105 of this modification, the reciprocating passage 112 is configured to be looped. When the reciprocating passage 112 is looped, the heat transportation performance of the working liquid 14 due to the self-excited oscillation is further improved. Thereby, the semiconductor device 105 of this modification can have the high cooling performance. As shown in FIG. 10, also in the looped reciprocating passage 112, the part of the reciprocating passage 112 which extends along the thickness direction of the reciprocating passage 112 may be selectively located according to the existing area of the gate electrodes 34 in the view along the direction orthogonal to the upper surface of the semiconductor layer 20 (Z direction). Thereby, the semiconductor device 105 of this modification can have both of the high rigidity and the high cooling performance.

Figure 11:
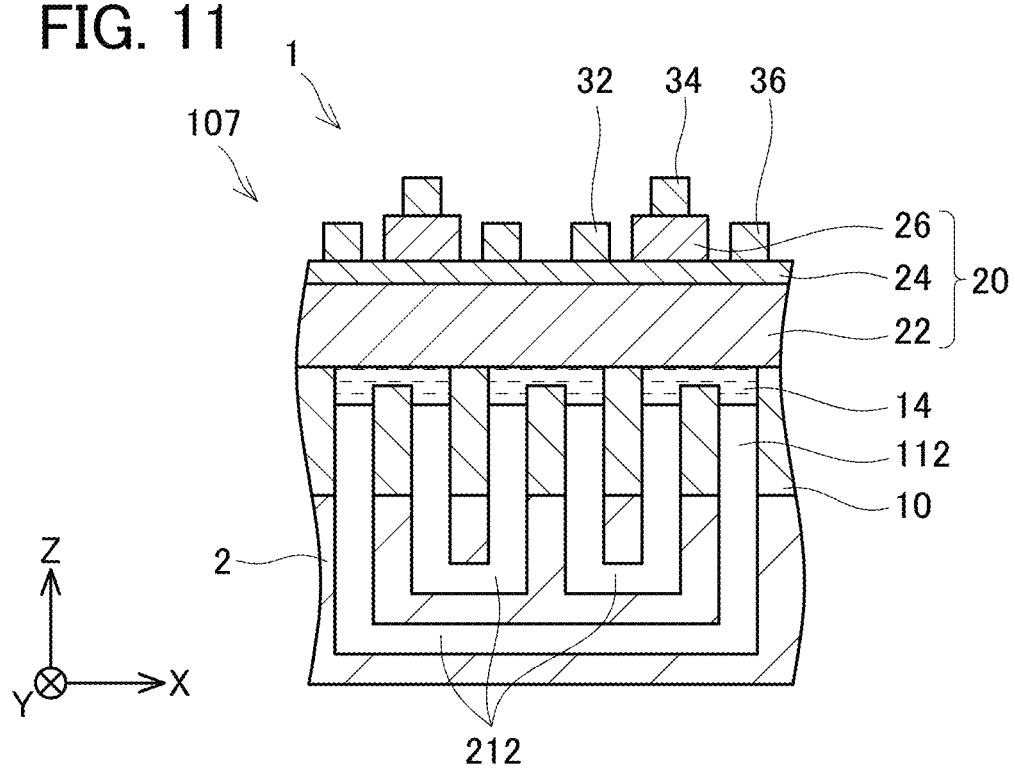
FIG. 11 illustrates a schematic sectional view of a semiconductor module comprising a semiconductor device according to a modification.

As shown in FIG. 11, in the semiconductor device 107 of this modification, a communication passage 212 is formed in the heat dissipation plate 2. The communication passage 212 communicates with the reciprocating passage 112 of the support layer 10. A passage formed by combination of the heat dissipation plate 2 and the reciprocating passage 112 of the support layer 10 is configured to be looped. In this modification, since heat transportation from the working liquid 14 to the heat dissipation plate 2 is efficiently conducted, the semiconductor device 107 of this modification can have the high cooling performance.

(A Method for Manufacturing the Semiconductor Device 3)

A manufacturing process of the semiconductor device 3 shown in FIG. 2 will be explained hereinafter with reference to drawings.

Figure 12A:
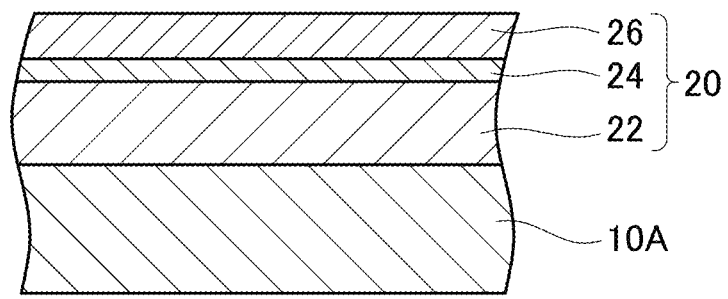
FIG. 12A illustrates a schematic sectional view of a process of manufacturing the semiconductor device of FIG. 2.

First, as shown in FIG. 12A, a base layer 10A made of silicon single crystal is prepared. Next, the semiconductor layer 20 (the channel layer 22, the barrier layer 24 and the p-GaN layer 26) is formed by epitaxially growing on an upper surface of the base layer 10A.

Figure 12B:
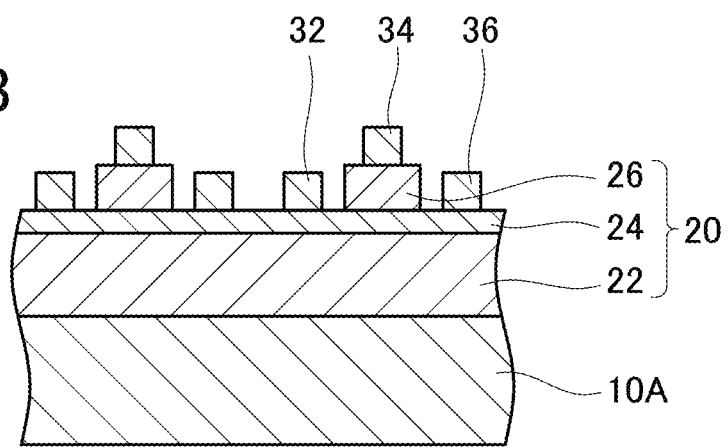
FIG. 12B illustrates a schematic sectional view of a process of manufacturing the semiconductor device of FIG. 2.

Next, as shown in FIG. 12B, the p-GaN layer 26 is patterned by etching. Further, the source electrodes 32, the gate electrodes 34 and the drain electrodes 36 (as well as the source terminal 32A, the gate terminal 34A and the drain terminal 36A) are formed by vapor deposition.

Figure 12C:
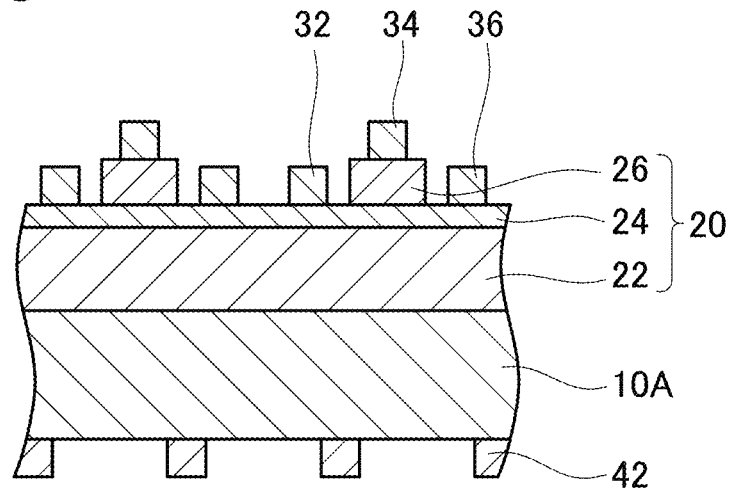
FIG. 12C illustrates a schematic sectional view of a process of manufacturing the semiconductor device of FIG. 2.

Next, as shown in FIG. 12C, a resist mask 42 is patterned at the lower side of the base layer 10A by using photolithography.

Figure 12D:
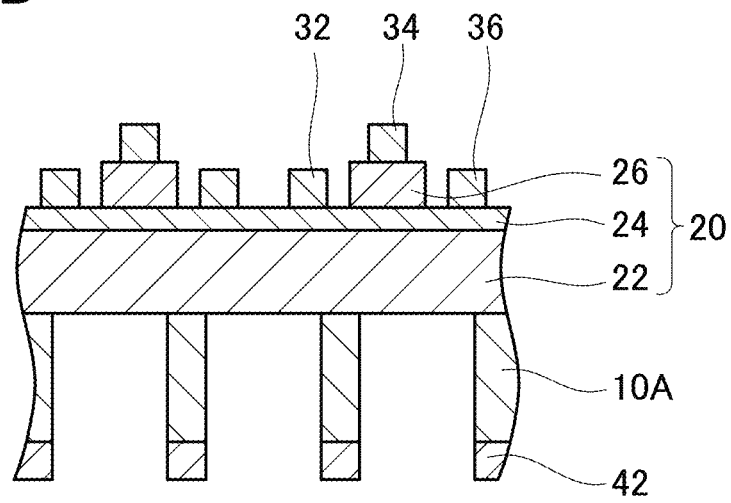
FIG. 12D illustrates a schematic sectional view of a process of manufacturing the semiconductor device of FIG. 2.

Next, as shown in FIG. 12D, a part of the base layer 10A which has been exposed from the resist mask 42, is removed using RIE. At this time, the etching can be preferably stopped at an interface between the base layer 10A and the semiconductor layer 20 by selecting reaction conditions under which silicon is selectively etched.

Figure 12E:
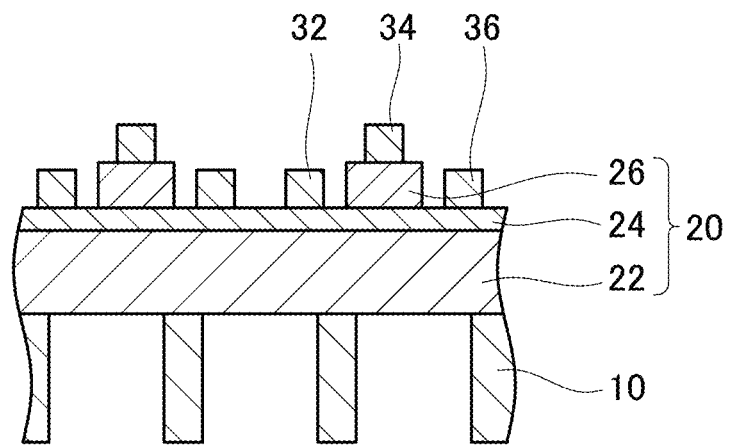
FIG. 12E illustrates a schematic sectional view of a process of manufacturing the semiconductor device of FIG. 2.

Next, as shown in FIG. 12E, the resist mask 42 is removed by etching.

Figure 12F:
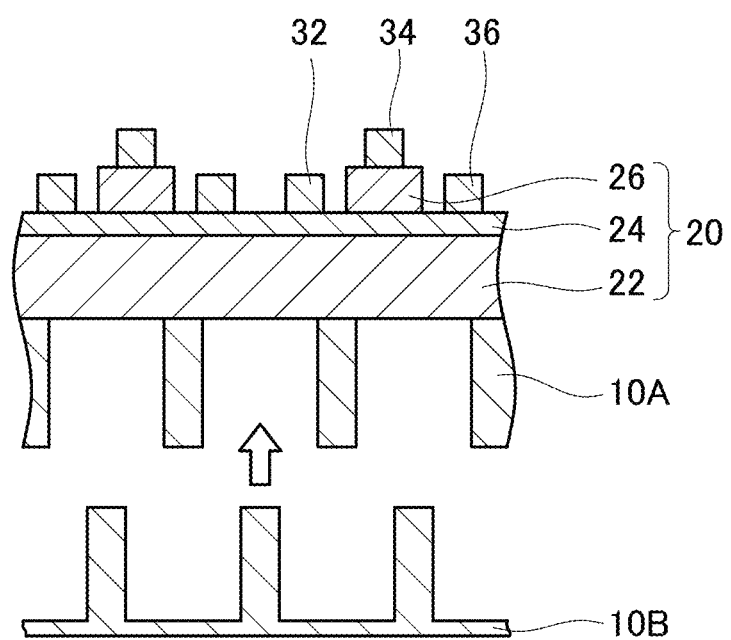
FIG. 12F illustrates a schematic sectional view of a process of manufacturing the semiconductor device of FIG. 2.

Next, as shown in FIG. 12F, a cap layer 10B made of silicon single crystal is prepared. The cap layer 10B is formed by performing RIE on a silicon layer, which was separately prepared.

Figure 12G:
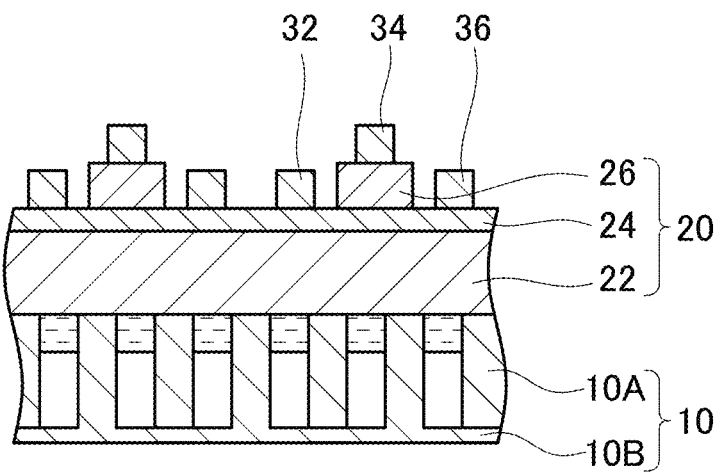
FIG. 12G illustrates a schematic sectional view a process of manufacturing the semiconductor device of FIG. 2.

Next, as shown in FIG. 12G, the base layer 10A and the cap layer 10B are bonded by normal temperature solid-phase bonding. Specifically, after having activated the interface of the base layer 10A and the cap layer 10B with argon ions, the base layer 10A and the cap layer 10B are caused to make contact in an ultra-high vacuumed environment and bonded therein. The bonded structure of the base layer 10A and the cap layer 10B corresponds to the support layer 10 shown in FIG. 2. Next, the working liquid is injected from a hole for liquid injection formed in the cap layer 10B (not shown) and the hole is sealed thereafter. The hole for liquid injection may be formed in the base layer 10A. The semiconductor device 3 shown in FIG. 2 is manufactured by these processes.

(A Manufacturing Process of Semiconductor Device 103)

A manufacturing process of the semiconductor device 103 shown in FIG. 7 will be explained hereinafter with reference to drawings.

Figure 13A:
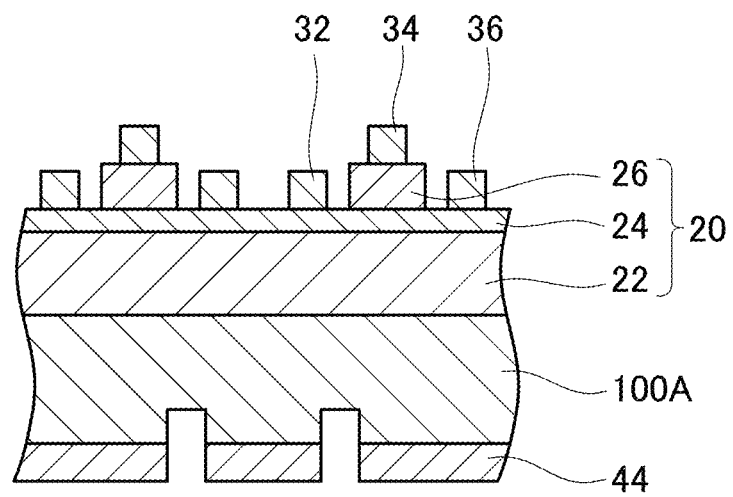
FIG. 13A illustrates a schematic sectional view of a process of manufacturing the semiconductor device of FIG. 7.

Processes similar to those in the manufacturing process of the semiconductor device 3 described above are performed until the electrodes are manufactured. Next, as shown in FIG. 13A, the resist mask 44 is patterned at a lower surface of a base layer 100A by using the photoresist technology. Next, a part of the base layer 100A exposed from the resist mask is removed using the RIE, and grooves are formed at the lower surface of the base layer 100A.

Figure 13B:
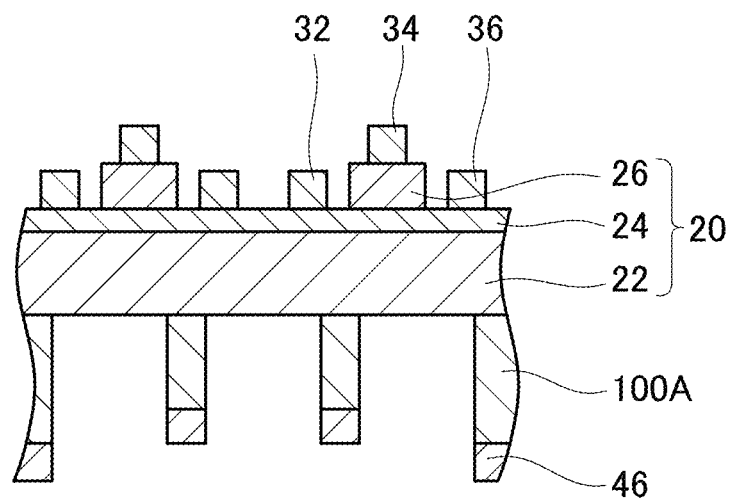
FIG. 13B illustrates a schematic sectional view of a process of manufacturing the semiconductor device of FIG. 7.

Next, as shown in FIG. 13B, the resist mask 46 is patterned by using the photolithography so that the grooves at the lower surface of the base layer 100A remain. Next, the base layer 100A exposed from the resist mask 46 is removed by using the RIE.

Figure 13C:
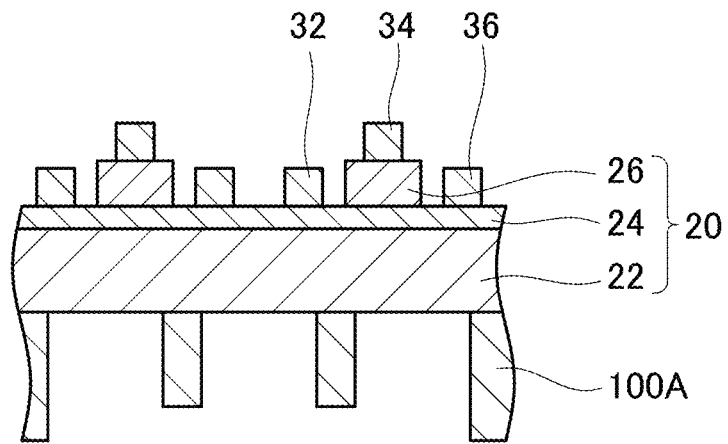
FIG. 13C illustrates a schematic sectional view of a process of manufacturing the semiconductor device of FIG. 7.

Next, as shown in FIG. 13C, the resist mask 46 is removed by using etching technology.

Figure 13D:
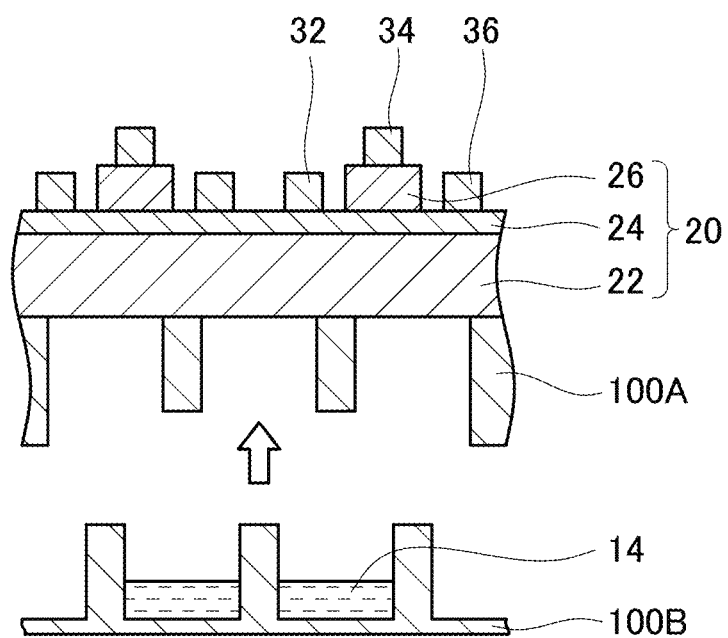
FIG. 13D illustrates a schematic sectional view of a process of manufacturing the semiconductor device of FIG. 7.

Next, as shown in FIG. 13D, a cap layer 100B made of a silicon single crystal, is prepared. The cap layer 100B is formed by performing the RIE on a silicon layer which was separately prepared. The working liquid 14 is stored in grooves of the cap layer 100B.

Figure 13E:
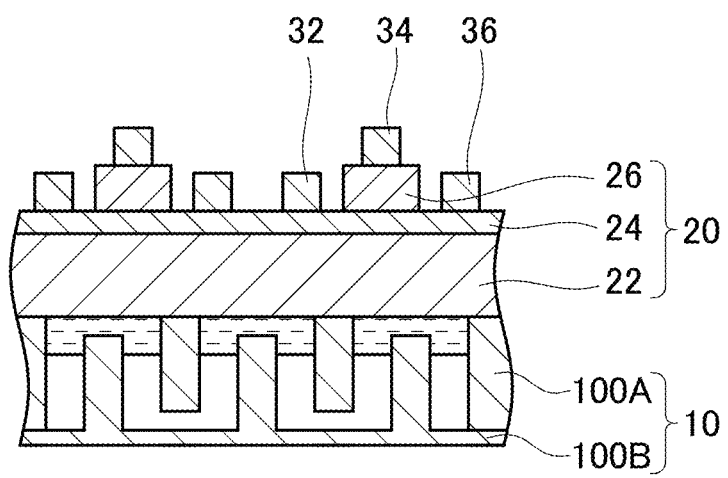
FIG. 13E illustrates a schematic sectional view of a process of manufacturing the semiconductor device of FIG. 7.

Next, as shown in FIG. 13E, the base layer 100A and the cap layer 100B are bonded. The bonded structure of the base layer 100A and the cap layer 100B corresponds to the support layer 10 shown in FIG. 7. The semiconductor device 103 shown in FIG. 7 is manufactured by these processes.

Figure 14:
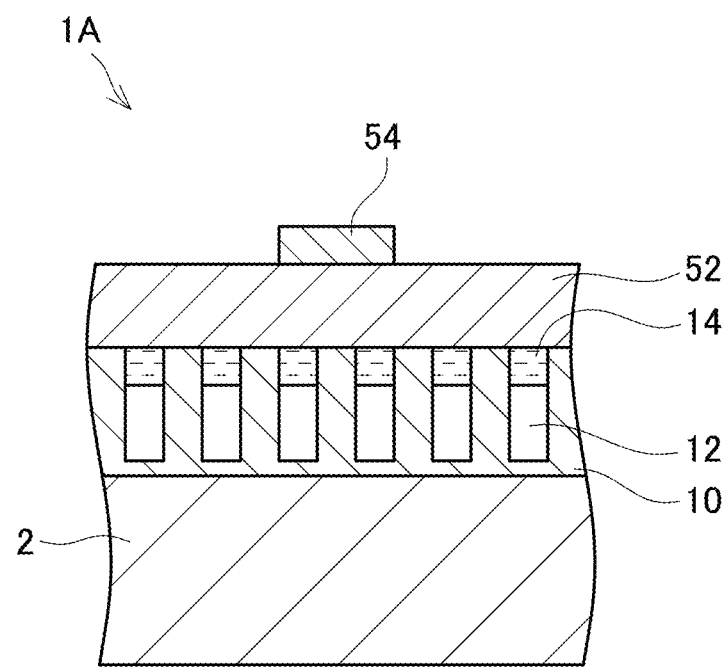
FIG. 14 illustrates a schematic sectional view of a module comprising a heat generator.

In the above embodiments, techniques disclosed in this specification were explained with the semiconductor module 1 as an example. For example, the techniques disclosed in this specification are useful also in a module 1A shown in FIG. 14. The module 1A comprises a metal layer 52 and a heat generator 54 in place of the semiconductor device. The metal layer 52 is bonded to the support layer 10. The metal layer 52 may be bonded to the support layer 10 via the insulating layer. The heat generator 54 is fixed on the metal layer 52 and exerts specific functions. The heat generated in the heat generator 54 is transferred to the support layer 10 via the metal layer 52 in this module 1A. Since the support layer 10 has the plurality of straight passages 12 working as a heat pipe, the support layer has a high heat transportation performance. Thus, the heat generator 54 is maintained at a low temperature during operation, and it can stably work. Like in the embodiments described above, various types of the flow passages provided in the support layer 10 may be adopted not limited to the straight passages 12.

Further, in the above embodiments, the case where the support layer is made of the semiconductor was explained. For example, the support layer may alternatively be made of a metal. When the support layer 10 is made of a metal, the support layer may be manufactured by a 3D printer technology using metal powders or a nano-printer technology.

Specific examples of the present invention has been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:

1. An apparatus comprising:
    a support layer adapted for supporting a heat generator, wherein the heat generator is configured to be disposed above the support layer, wherein
    the support layer includes a flow passage in which working fluid is sealed,
    at least a part of the flow passage extends along a thickness direction of the support layer and is configured to be located under the heat generator, the thickness direction of the support layer extending perpendicular to an upper surface of the support layer, and
    the part of the flow passage extending along the thickness direction is configured such that working fluid sealed therein moves along the thickness direction.

2. The apparatus according to claim 1, wherein a material of the support layer is a semiconductor.

3. The apparatus according to claim 2, wherein the flow passage comprises a two-pass passage along the thickness direction of the support layer.

4. The apparatus according to claim 2, wherein the flow passage comprises a plurality of straight passages which extends along the thickness direction of the support layer.

5. The apparatus according to claim 4, wherein one or more of the straight passages are tapered toward the heat generator.

6. The apparatus according to claim 4, wherein wicked structures are disposed on inner surfaces of one or more of the straight passages.

7. The apparatus according to the claim 2, further comprising:
    a semiconductor layer disposed above the support layer, wherein the semiconductor layer comprises a semiconductor region that configures a semiconductor element, and
    the semiconductor element is the heat generator.

8. The apparatus according to claim 7, further comprising:
    a source electrode being in contact with an upper surface of the semiconductor layer and extending along one direction;
    a drain electrode being in contact with the upper surface of the semiconductor layer and extending along the one direction; and
    a gate electrode disposed above the upper surface of the semiconductor layer, located between the source electrode and the drain electrode, and extending along the one direction,
    wherein in a view along a direction which is orthogonal to the upper surface of the semiconductor layer, the flow passage is selectively located according to an existing area of the source electrode, the drain electrode and the gate electrode.

9. The apparatus according to claim 8, wherein
    in the view along the direction which is orthogonal to the upper surface of the semiconductor layer, the flow passage is selectively located according to an existing area of the gate electrode.

10. The semiconductor device according to claim 7, wherein
    a material of the support layer is silicon, and
    a material of the semiconductor layer is a nitride semiconductor.

11. The apparatus according to the claim 1, further comprising:
    a heat dissipation plate made of metal, disposed under the support layer and including a communication passage communicating with the flow passage of the support layer.

12. A method of manufacturing the apparatus according to claim 7, the method comprising:
    crystal-growing a semiconductor layer on a support layer;
    forming a semiconductor region in the semiconductor layer, the semiconductor region configuring a semiconductor element;
    forming a flow passage by processing the support layer; and
    sealing working fluid in the flow passage.

13. The apparatus according to claim 1, wherein the flow passage is in direct contact with the heat generator.

14. The apparatus according to claim 1, wherein a width of the flow passage is between about 0.1 to 100 µm.

15. An apparatus comprising:
    a support layer adapted for supporting a heat generator, and
    a semiconductor layer disposed above the support layer, wherein the support layer includes a flow passage in which working fluid is sealed,
    a material of the support layer is a semiconductor,
    at least a part of the flow passage extends along a thickness direction of the support layer,
    the semiconductor layer comprises a semiconductor region that configures a semiconductor element, and
    the semiconductor element is the heat generator.

* * * * *